US011218137B2

(12) United States Patent
Saha et al.

(10) Patent No.: US 11,218,137 B2
(45) Date of Patent: Jan. 4, 2022

(54) LOW CLOCK LOAD DYNAMIC DUAL OUTPUT LATCH CIRCUIT

(71) Applicant: GLOBALFOUNDRIES U.S. INC., Santa Clara, CA (US)

(72) Inventors: Uttam Saha, San Jose, CA (US); Mahbub Rashed, Cupertino, CA (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 17 days.

(21) Appl. No.: 16/847,807

(22) Filed: Apr. 14, 2020

(65) Prior Publication Data
US 2021/0320650 A1 Oct. 14, 2021

(51) Int. Cl.
*H03K 3/037* (2006.01)
*H03K 19/20* (2006.01)

(52) U.S. Cl.
CPC .............. *H03K 3/037* (2013.01); *H03K 19/20* (2013.01)

(58) Field of Classification Search
CPC ......... H03K 3/037; H03K 19/20; H03K 3/356
See application file for complete search history.

(56) References Cited

U.S. PATENT DOCUMENTS

| | | | | |
|---|---|---|---|---|
| 3,588,546 A | * | 6/1971 | Lagermann | H03K 3/0372 327/215 |
| 4,663,701 A | * | 5/1987 | Stotts | H03K 3/356017 363/60 |
| 4,667,303 A | * | 5/1987 | Pfennings | H03K 3/356104 708/702 |
| 4,691,122 A | * | 9/1987 | Schnizlein | G11C 19/28 327/203 |
| 4,768,167 A | * | 8/1988 | Yoder | H03K 3/0375 365/154 |
| 4,871,933 A | * | 10/1989 | Galbraith | H03K 3/356113 327/53 |
| 4,871,978 A | * | 10/1989 | Galbraith | H03K 3/356113 330/253 |
| 4,873,456 A | * | 10/1989 | Olisar | H03K 3/012 327/202 |
| 4,980,583 A | * | 12/1990 | Dietz | H03K 3/356104 326/17 |
| 5,760,610 A | | 6/1998 | Naffziger | |
| 6,081,136 A | | 6/2000 | Khanna et al. | |
| 6,310,499 B1 | | 10/2001 | Radjassamy | |
| 6,323,710 B1 | | 11/2001 | Piguet et al. | |
| 6,577,176 B1 | * | 6/2003 | Masleid | H03K 5/1252 327/199 |

(Continued)

OTHER PUBLICATIONS

Office Action dated Oct. 8, 2020 in related Application No. 16/881,053, 13 pages.

*Primary Examiner* — Adam D Houston
(74) *Attorney, Agent, or Firm* — David Cain; Andrew M. Calderon; Roberts Calderon Safran & Cole, P.C.

(57) ABSTRACT

The present disclosure relates to integrated circuits, and more particularly, to a low clock load dynamic dual output latch circuit and methods of operation. The structure includes: a plurality of dynamic clocked stacks which are configured to receive input data and provide a true logical value and a complement logical value; and a plurality of holding stacks which are configured to provide a hold signal to the dynamic clocked stacks and output the true logical value and the complement logical value in response to the hold signal being activated.

20 Claims, 1 Drawing Sheet

(56) References Cited

U.S. PATENT DOCUMENTS

| | | |
|---|---|---|
| 6,603,333 B2 | 8/2003 | Vinh et al. |
| 6,621,319 B1 * | 9/2003 | Herrera ............ H03K 3/356113 327/199 |
| 6,791,361 B2 | 9/2004 | Alon et al. |
| 6,960,941 B2 | 11/2005 | Cantin et al. |
| 7,282,957 B2 | 10/2007 | Sumita |
| 7,710,155 B2 | 5/2010 | Bhatia et al. |
| 9,160,317 B2 | 10/2015 | Singh et al. |
| 9,461,633 B1 | 10/2016 | Foroudi |
| 9,742,382 B2 | 8/2017 | Cai et al. |
| 10,581,412 B1 * | 3/2020 | Venugopal ............ H03K 3/037 |
| 2004/0263229 A1 | 12/2004 | Minzoni |
| 2005/0225372 A1 * | 10/2005 | Kim ...................... H03K 3/012 327/218 |
| 2006/0022717 A1 | 2/2006 | Park |
| 2008/0130396 A1 | 6/2008 | Gomm et al. |
| 2008/0159042 A1 * | 7/2008 | Bertin ................... G11C 17/18 365/225.7 |
| 2008/0258775 A1 | 10/2008 | Wendell |
| 2008/0258788 A1 * | 10/2008 | Bhatia .............. H03K 3/356121 327/201 |
| 2009/0079483 A1 * | 3/2009 | Keskin .................. H03K 3/037 327/161 |
| 2012/0146697 A1 * | 6/2012 | Leach ................ H03K 3/35625 327/202 |
| 2012/0182056 A1 * | 7/2012 | Dally ..................... H03K 3/012 327/202 |
| 2014/0266364 A1 * | 9/2014 | Singh .............. H03K 3/356121 327/202 |
| 2014/0306743 A1 * | 10/2014 | Hsieh ............... H03K 3/356191 327/200 |
| 2015/0263706 A1 * | 9/2015 | Nakayama ....... H03K 3/356121 327/202 |
| 2016/0365856 A1 * | 12/2016 | Ye ...................... H03K 19/0013 |
| 2018/0026612 A1 * | 1/2018 | Kurokawa ............ H03K 3/012 326/121 |
| 2020/0007114 A1 * | 1/2020 | Kimura .................. G06N 3/063 |
| 2020/0028498 A1 * | 1/2020 | Kimura .................... G06N 3/04 |
| 2020/0135243 A1 * | 4/2020 | Kim ................... H03F 3/45179 |
| 2020/0213165 A1 * | 7/2020 | Iyer ..................... H04L 25/061 |
| 2020/0395923 A1 * | 12/2020 | Kim ..................... H03K 3/0372 |

* cited by examiner

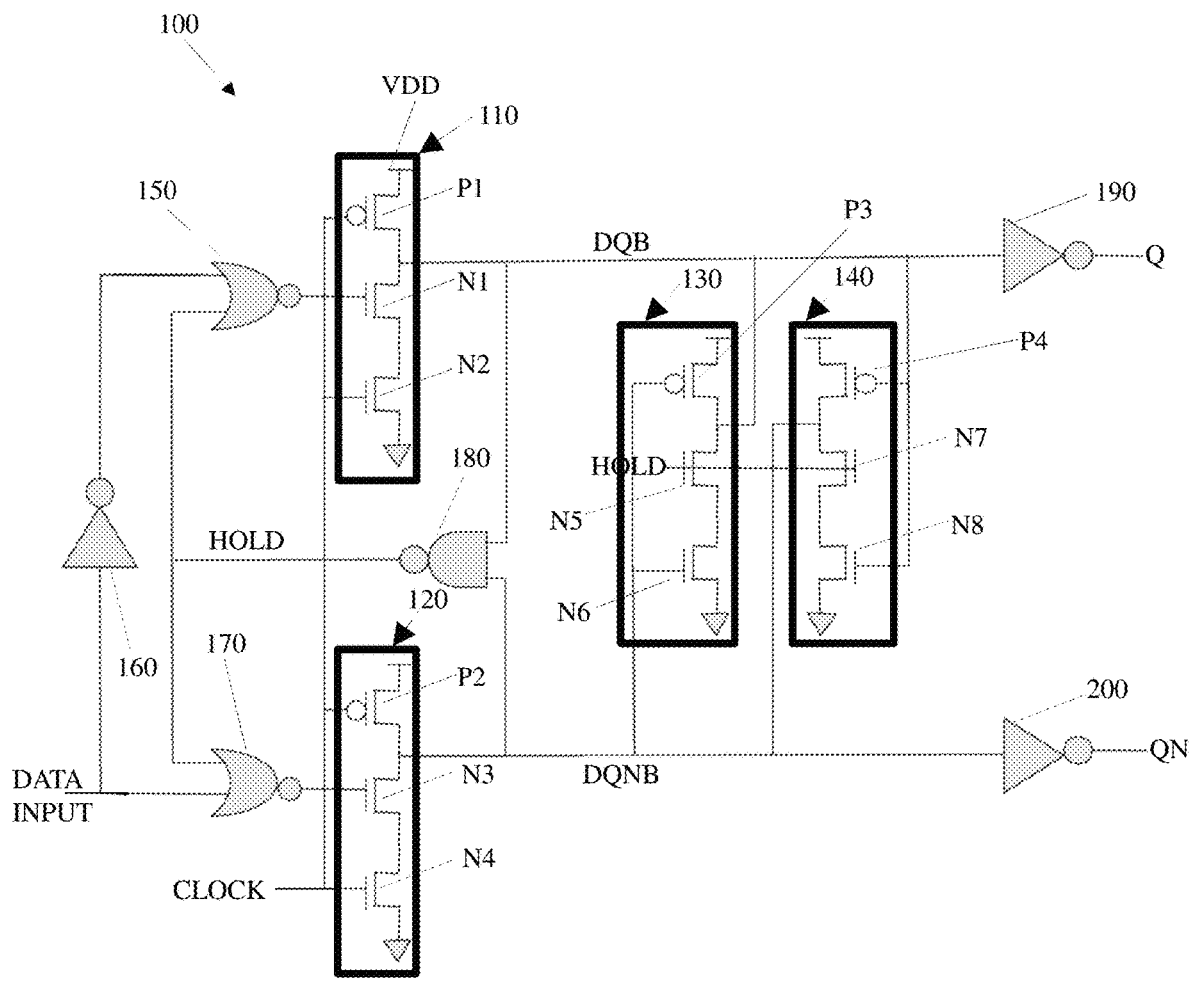

LOW CLOCK LOAD DYNAMIC DUAL OUTPUT LATCH CIRCUIT

FIELD OF THE INVENTION

The present disclosure relates to integrated circuits, and more particularly, to a low clock load dynamic dual output latch circuit and methods of operation.

BACKGROUND

Clocks are important elements in flops and latches and contribute the major switching power in most system on chip (SoC) designs. For example, in an Advanced Reduced Instruction Set Computing Machine (ARM) low power mobile architecture, approximately 30-35% of the switching power comes from clock gates in flops and latches. In a microprocessor without interlocked pipelined stages (MIPS) architecture used in mobile and machine learning designs, the clock contributes approximately 30-35% of the switching power. In higher frequency and other designs, the clock can contribute up to approximately 40% of the switching power.

A challenge to reducing the switching power is having a smaller flop design. For example, approximately 25-35% of the gate counts are flops and latches in SoC designs. For example, in the ARM architecture, there are about 12,000 total gates of which approximately 3,600 gates are flops and latches (i.e., about 30% of the total gates). Further, if the core design requires 1 million gates, the design will require approximately 250,000-450,000 gates as flops and latches.

SUMMARY

In an aspect of the disclosure, a structure comprises: a plurality of dynamic clocked stacks which are configured to receive input data and provide a true logical value and a complement logical value; and a plurality of holding stacks which are configured to provide a hold signal to the dynamic clocked stacks and output the true logical value and the complement logical value in response to the hold signal being activated.

In another aspect of the disclosure, a circuit comprises: a first NOR gate which receives an inverted data signal and a hold signal and outputs a first gate signal; a second NOR gate which receives a data signal and the hold signal and outputs a second gate signal; a first set of transistors which receives the first gate signal and outputs a true logical value; a second set of transistors which receives the second gate signal and outputs a complement logical value; a third set of transistors which receives the hold signal and the complement logical value; and a fourth set of transistors which receives the hold signal and the true logical value.

In another aspect of the disclosure, a method comprises: receiving an input data and outputting a true logical value and a complement logical value through a first stage circuit of a dynamic latch circuit; and receiving the true logical value and the complement logical value and evaluating the true logical value and the complement logical value in response to a hold signal being activated through a second stage circuit of the dynamic latch circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGURE shows a circuit diagram of a dynamic latch in accordance with aspects of the present disclosure.

DETAILED DESCRIPTION

The present disclosure relates to integrated circuits, and more particularly, to a low clock load dynamic dual output latch circuit and methods of operation. More specifically, the present disclosure provides a dynamic dual output latch circuit design which has a smaller pitch area and reduced clock driving load. Advantageously, by implementing the circuits disclosed herein, the circuits can reduce the switching power, capacitance load, and use fewer circuit elements (i.e., fewer transistors).

In known circuits, clocks significantly contribute to the switching power in a system on chip (SoC). Further, known circuits require a large amount of polysilicon pitch area, require a large number of transistors, and a large amount of clock driving load. In contrast to known circuits, the present disclosure reduces the clock load in flops and latches to reduce the switching power while also having a smaller flop design to save chip area. Further, the present disclosure can be used in any number of circuits, including static random access memories (SRAMs), read-only memories (ROMs), comparators, content addressable memories (CAMs), fast adders, arithmetic logic units (ALUs), Booth coders/decoders, any decoding circuit, and synchronizer circuits, etc.

In embodiments, a dynamic latch can include a first stage for receiving an input data value for providing true and compliment logic values and a second stage for evaluating the true and compliment logic values. The true and compliment logic values are implemented when the clock is active and the output data is latched when the hold makes a transition to high. This dynamic latch evaluation and keeper are non-interfering to each other.

More specifically, the FIGURE shows a circuit diagram of a dynamic latch in accordance with aspects of the present disclosure. In FIGURE, the dynamic latch circuit 100 includes dynamic clocked stacks 110, 120, holding stacks 130, 140, NOR gates 150, 170, inverters 160, 190, 200, and NAND gate 180.

In the FIGURE, each of the stacks 110, 120, 130, and 140 include one PMOS transistor and two NMOS transistors connected in series (i.e., a PMOS transistor is connected to a NMOS transistor which is connected to another NMOS transistor). In particular, the dynamic clocked stack 110 includes a PMOS transistor P1 and two NMOS transistors N1, N2 in series. The dynamic clocked stack 120 includes a PMOS transistor P2 and two NMOS transistors N3, N4 in series. The holding stack 130 include a PMOS transistor P3 and two NMOS transistors N5, N6 in series. The holding stack 140 includes a PMOS transistor P4 and two NMOS transistors N7, N8 in series.

In FIGURE, the NOR gate 170 receives a DATA INPUT signal and a HOLD signal, and outputs a first gate signal to a gate of the NMOS transistor N3. Further, the NOR gate 150 receives an inverted DATA INPUT signal (i.e., the DATA INPUT signal which is inverted by the inverter 160) and the HOLD signal, and outputs a second gate signal to a gate of the NMOS transistor N1. Further, a CLOCK signal is input to a gate of PMOS transistors P1, P2 and a gate of NMOS transistors N2, N4. The NOR gate 170 and the inverter 160 are connected to each other and both receive the DATA INPUT signal.

In FIGURE, a drain of the PMOS transistor P1 and a drain of the NMOS transistor N1 are connected to a true signal value DQB. Further, a drain of the PMOS transistor P2 and a drain of the NMOS transistor N3 are connected to a complement signal DQNB. Further, the true signal value DQB and the complement signal value DQNB are input to the NAND gate 180 and an output of the NAND gate 180 is connected to the HOLD signal. The true signal value DQB is parallel to the complement signal value DQNB.

In FIGURE, the true signal value DQB is also connected to the drain of the PMOS transistor P3, the drain of the NMOS transistor N5, the gate of the PMOS transistor P4, and the gate of the NMOS transistor N8. The complement signal value DQNB is connected to the drain of the PMOS transistor P4, the drain of the NMOS transistor N7, the gate of the PMOS transistor P3, and the gate of the NMOS transistor N6. The HOLD signal is also connected to the gates of NMOS transistors N5 and N7.

In FIGURE, the inverter 190 receives the true signal value DQB and outputs a true data output Q. Further, the inverter 200 receives the complement signal value DQNB and outputs a complement data output QN. Each source of the PMOS transistors P1, P2, P3, and P4 receives a power supply voltage (e.g., VDD). Further, each source of the NMOS transistors N2, N4, N6, and N8 are connected to a ground.

In operation of the circuit shown in FIGURE, the dynamic clocked stacks 110, 120 of the dynamic latch circuit 100 receives the DATA INPUT signal and proves the true signal value DQB and the complement signal value DQNB. Further, the holding stacks 130, 140 evaluate (i.e., output) the true signal value DQB and the complement signal value DQNB when the CLOCK signal is active (e.g., when the CLOCK signal is active high or at a "1" value). Further, the holding stacks 130, 140 also provide the HOLD signal to the dynamic clocked stacks 110, 120 to block propagation of changes to the DATA INPUT signal when the CLOCK signal is active (e.g., when the CLOCK signal is active high or at a "1" value). The HOLD signal is derived when the outputs (i.e., the true data output Q and the complement data output QN) of the dynamic latch circuit 100 are evaluated.

Further and more specifically, when the CLOCK signal is not active (e.g., when the CLOCK signal is low or at a "0" value), PMOS transistors P1, P2 precharge the true signal value DQB and the complement signal value DQNB to the power supply voltage (e.g., VDD). As a result of the precharging, the NAND gate 180 is at logic low (i.e., at a "0" value) to allow the DATA INPUT signal to propagate through the NOR gate 170 and the inverted DATA input signal to propagate through NOR gate 150.

On the other hand, when the CLOCK signal is active (e.g., when the CLOCK signal is active high or at a "1" value), PMOS transistors P1, P2 are turned off and the NMOS transistors N2 and N4 are turned on. Therefore, the dynamic clocked stack 110 evaluates (i.e., outputs) the inverted DATA INPUT signal at the true signal value DQB and the dynamic clocked stack 120 evaluates (i.e., outputs) the DATA INPUT signal at the complement signal value DQNB.

Since the gate of the NMOS transistor N1 receives the inverted DATA INPUT signal and the gate of the NMOS transistor N3 receives the DATA input signal (i.e., the gate of the NMOS transistor N1 has an inverted input with respect to the input of the gate of the NMOS transistor N3), one of the true signal value DQB and the complement signal value DQNB is discharged to ground. In this scenario, NAND gate 180 is at logic high (i.e., at a "1" value), which blocks propagation of any change in the DATA INPUT signal to the NOR gate 170 and blocks propagation of any change in the inverted DATA INPUT signal to the NOR gate 150.

After the NAND gate 180 is at logic high, the HOLD signal turns on the NMOS transistors N5 and N7. The true signal value DQB or the complement signal value DQNB that is discharged is held to ground by one of the corresponding NMOS transistors N6 and N8 (i.e., the true signal value DQB corresponds to NMOS transistor N8 and the complement signal value DQNB corresponds to NMOS transistor N6). Further, the true signal value DQB or the complement signal DQNB that is not discharged is held to the power supply voltage (i.e., VDD) by one of the corresponding PMOS transistors P3 and P4 (i.e., the true signal value DQB corresponds to the PMOS transistor P4 and the complement signal value DQNB corresponding to the PMOS transistor P3). Thus, the holding stacks 130, 140 hold the true signal value DQB and the complement signal value DQNB for the outputs (i.e., the true data output Q and the complement data output QN) until the CLOCK signal becomes inactive (i.e., the CLOCK signal is low or at a "0" value). The true data output Q is an output of the inverter 190 and the complement data output QN is an output of the inverter 200.

The HOLD signal is not activated (i.e., logic high or at a "1" value) until the true signal value DQB and the complement signal value DQNB achieve full logic values. When the HOLD signal is activated (i.e., logic high or at a "1" value), the holding stacks 130, 140 maintain the true signal value DQB and the complement signal DQNB, even though charge leakage may exist. Also, by using a design of the dynamic latch circuit 100, the clock load per latch is lowered with a fewer number of transistors in comparison to known circuits.

In particular, the dynamic latch circuit 100 drives only four transistors (which is less than known circuits), has no extra wire, has a smaller clock load, and saves approximately 33% of the switching power. Further, by driving only four transistors in the dynamic latch circuit 100, two poly-silicon pitch area is saved. Further, in the dynamic latch circuit 100, there is approximately a 4% saving in the clock up to the output delay, approximately a 4% saving in the clock up to the hold up delay, a 33% savings in gate capacitance load, and a 29% savings in area in comparison to known circuits.

The circuit and the method of operation for a low clock load dynamic dual output latch circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a low clock load dynamic dual output latch circuit of the present disclosure has been adopted from integrated circuit (IC) technology. For example, the structures are built on wafers and are realized in films of material patterned by photolithographic processes on the top of a wafer. In particular, the fabrication of the circuit and the method for a low clock load dynamic dual output latch circuit uses three basic building blocks: (i) deposition of thin films of material on a substrate, (ii) applying a patterned mask on top of the films by photolithographic imaging, and (iii) etching the films selectively to the mask.

The low clock load dynamic dual output latch circuit can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of dynamic clocked stacks which are configured to receive input data and provide a true logical value and a complement logical value; and
   a plurality of holding stacks which are configured to provide a hold signal to the dynamic clocked stacks and output the true logical value and the complement logical value in response to the hold signal being activated,
   wherein each of the plurality of holding stacks include transistors which are devoid of any gate connection to a clocked input.

2. The structure of claim 1, wherein each of the plurality of dynamic clocked stacks comprise a single PMOS transistor and two NMOS transistors.

3. The structure of claim 2, wherein the plurality of dynamic clocked stacks comprises a first dynamic clocked stack and a second dynamic clocked stack.

4. The structure of claim 3, wherein the first dynamic clocked stack receives an inverted input data and outputs the true logical value.

5. The structure of claim 4, wherein the second dynamic clocked stack receives the input data and outputs the complement logical value.

6. The structure of claim 1, wherein the transistors of each of the holding stacks comprise a single PMOS transistor and two NMOS transistors.

7. The structure of claim 6, wherein the plurality of holding stacks comprise a first holding stack and a second holding stack.

8. The structure of claim 7, wherein the first holding stack receives the hold signal and the complement logical value.

9. The structure of claim 8, wherein the second holding stack receives the hold signal and the true logical value.

10. The structure of claim 1, further comprising a first inverter which receives the true logical value and outputs a true data output.

11. The structure of claim 10, further comprising a second inverter which receives the complement logical value and outputs a complement data output.

12. The structure of claim 11, further comprising a NAND gate which receives the true logical value and the complement logical value and outputs the hold signal.

13. A circuit, comprising:
   a first NOR gate which receives an inverted data signal and a hold signal and outputs a first gate signal;
   a second NOR gate which receives a data signal and the hold signal and outputs a second gate signal;
   a first set of transistors which receives the first gate signal and outputs a true logical value;
   a second set of transistors which receives the second gate signal and outputs a complement logical value;
   a third set of transistors which receives the hold signal and the complement logical value; and
   a fourth set of transistors which receives the hold signal and the true logical value,
   wherein the third set of transistors and the fourth set of transistors include transistors which are devoid of any gate connection to a clocked input.

14. The circuit of claim 13, further comprising a NAND gate which receives the true logical value and the complement logical value and outputs the hold signal.

15. The circuit of claim 14, further comprising a first inverter which receives the true logical value and outputs a true data output.

16. The circuit of claim 15, further comprising a second inverter which receives the complement logical value and outputs a complement data output.

17. A method, comprising:
   receiving an input data and outputting a true logical value and a complement logical value through a first stage circuit of a dynamic latch circuit; and
   receiving the true logical value and the complement logical value and evaluating the true logical value and the complement logical value in response to a hold signal being activated through a second stage circuit of the dynamic latch circuit,
   wherein the second stage circuit includes transistors which are devoid of any gate connection to a clocked input.

18. The method of claim 17, further comprising providing the hold signal based on the true logical value and the complement logical value.

19. The method of claim 18, further comprising inverting the true logical value to provide a true data output.

20. The method of claim 19, further comprising inverting the complement logical value to provide a complement data output.

* * * * *